United States Patent [19]

Masuda

[11] Patent Number: 4,963,774
[45] Date of Patent: Oct. 16, 1990

[54] INTERMEDIATE POTENTIAL SETTING CIRCUIT

[75] Inventor: Masami Masuda, Kawasaki, Japan

[73] Assignee: Kabushiki Kaisha Toshiba, Kawasaki, Japan

[21] Appl. No.: 305,220

[22] Filed: Feb. 2, 1989

[30] Foreign Application Priority Data

Feb. 5, 1988 [JP] Japan .................................. 63-25156

[51] Int. Cl.$^5$ ................. H03K 17/687; H03K 19/094; H03K 17/16; H03L 5/00
[52] U.S. Cl. ..................................... 307/585; 307/451; 307/443; 307/264
[58] Field of Search ............... 307/585, 576, 579, 264, 307/443, 451

[56] References Cited

U.S. PATENT DOCUMENTS 4,689,504  8/1987  Raghunathan et al. ............ 307/585

Primary Examiner—Stanley D. Miller
Assistant Examiner—Trong Phan
Attorney, Agent, or Firm—Finnegan, Henderson, Farabow, Garrett and Dunner

[57] ABSTRACT

An intermediate potential setting circuit comprises a pair of transistors which have gate terminals supplied with a control signal and are turned on when the control signal is set active; and a pair of complementary transistors which have gate terminals connected to an intermediate potential setting line and gate and drain terminals which are short-circuited to each other by the pair of transistors. The intermediate potential setting circuit can be operated by use of a small amount of current.

17 Claims, 5 Drawing Sheets

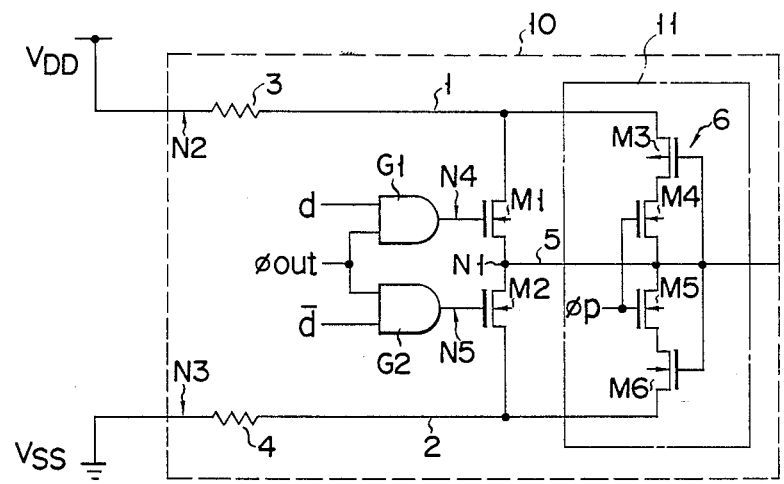
F I G. 1
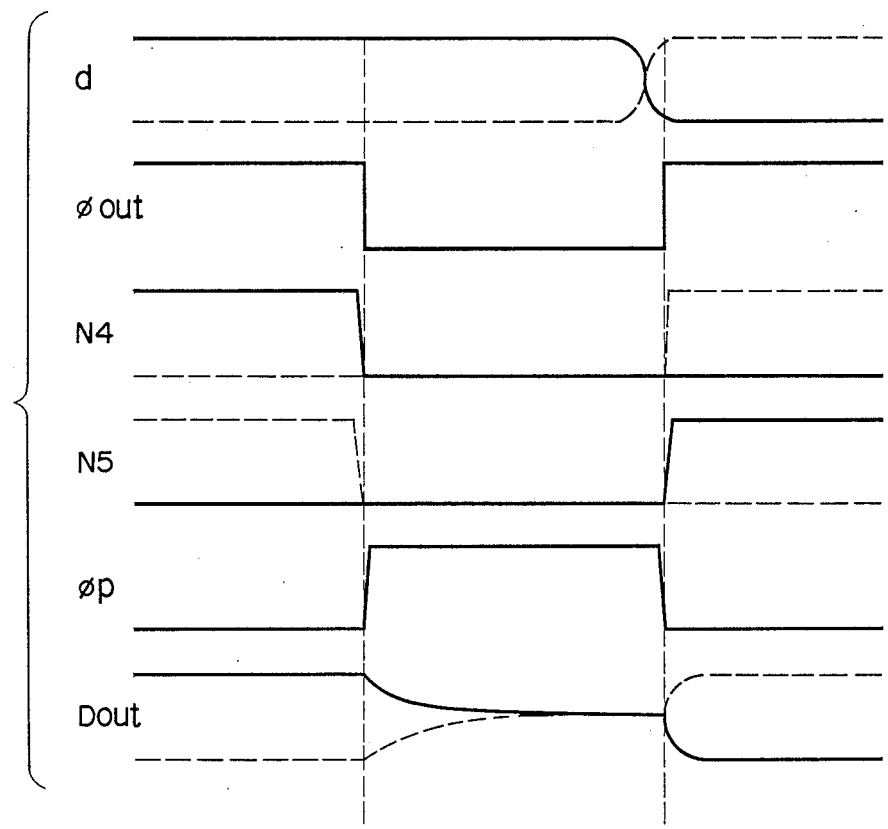
F I G. 2

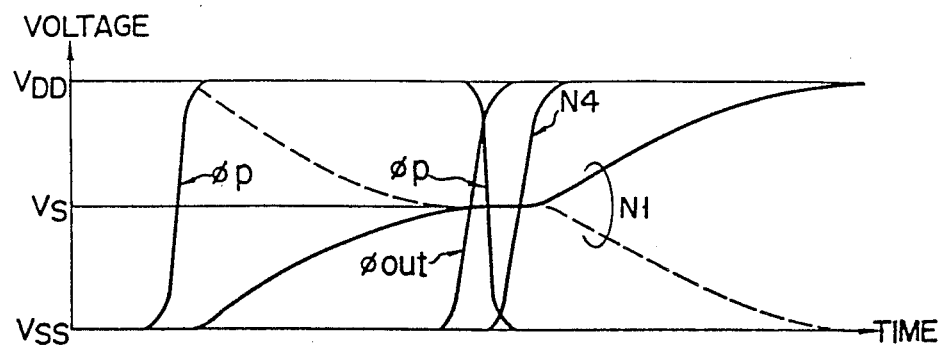
F I G. 3A
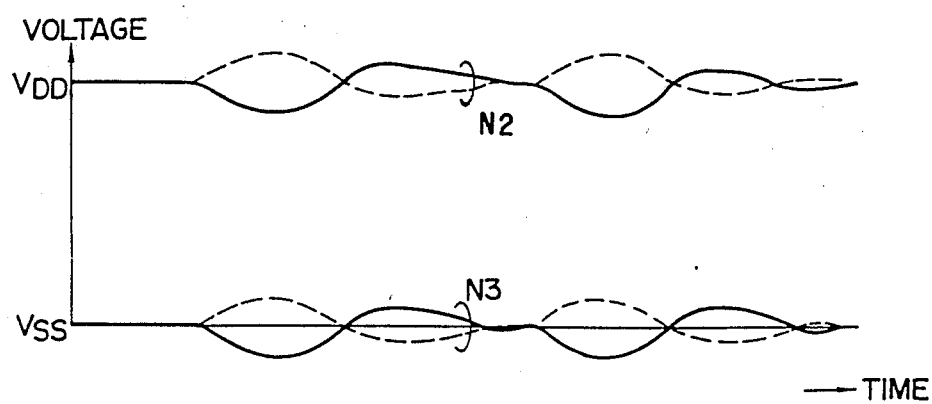
F I G. 3B

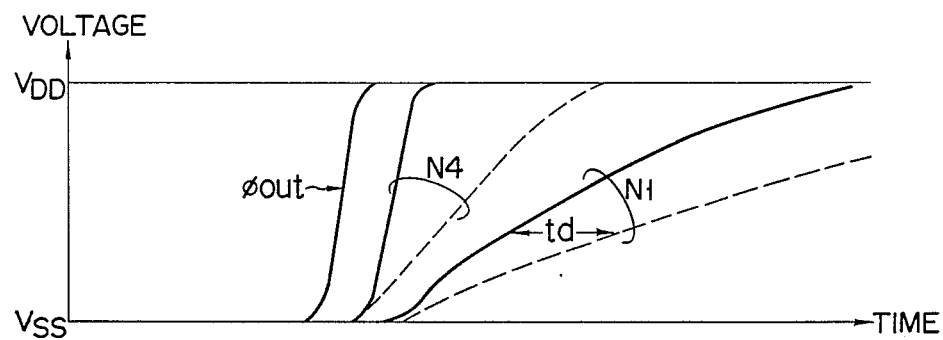
F I G. 6A
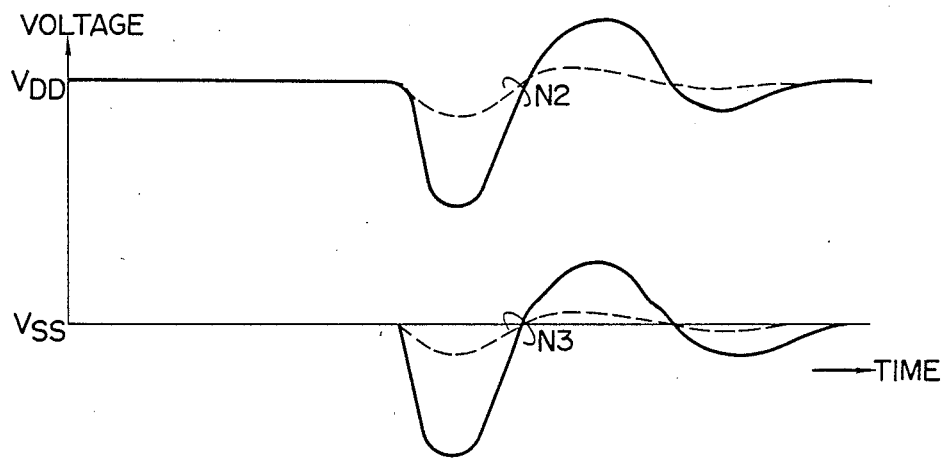
F I G. 6B

INTERMEDIATE POTENTIAL SETTING CIRCUIT

BACKGROUND OF THE INVENTION

1. Field of the Invention

This invention relates to a semiconductor integrated circuit of a memory integrated circuit or the like, and more particularly to an intermediate potential setting circuit for setting the output potential of a data output circuit to an intermediate potential level immediately before the output of data.

2. Description of the Related Art

FIG. 5 shows an example of a data output circuit of semiconductor integrated circuit 40, a power source system and an output load. In FIG. 5, M1 and M2 denote data output MOS transistors, G1 and G2 data output control gates, N1 a data output terminal, N2 a power source terminal in a chip, N3 a ground terminal in the chip, E a D.C. power source for supplying a VDD power source voltage to the chip, C2 a voltage stabilizing capacitor, and C1 an output load capacitor. Wiring sections arranged inside and outside the chip have resistors R1 to R5 and impedance elements L1 to L3 as parasitic elements.

In the above data output circuit, power source potential VDD and ground potential VSS inside the chip will vary (or output noise occurs) in a case where output load C1 is rapidly charged or discharged at the data output time, causing the internal circuit of the semiconductor integrated circuit to be erroneously operated. Now, the operation of the circuit of FIG. 5 in which data output changes from "0" to "1" is explained with reference to FIGS. 6A and 6B. When output control signal φout is set to "1" level while complementary data d and d̄ are respectively kept at "1" and "0", output nodes N4 and N5 of gates G1 and G2 are respectively set into "1" and "0" states. As a result, output node N1 is set to "1" level, and transistor M1 is turned on, thus charging output load C1. At this time, the potentials of power source terminals N2 and N3 in the chip will vary due to the voltage drop occurring in parasitic elements R1, R2, R4, L1 and L2 associated with a current path in which charging current Id flows. In particular, when data "1" are simultaneously output at a plurality of data output terminals and corresponding data output terminals, the power source potential varies significantly so that the internal circuit of the input buffer or the like may tend to be erroneously operated.

In contrast, when the data output varies from "1" to "0", output load C1 is discharged. At this time, the ground potential in the chip and the power source potential in the chip may vary by the discharging current and said parasitic elements, causing the same problem as described above.

Typically, in order to suppress the power source potential variation at the time of change of data output, the gate widths of output MOS transistors M1 and M2 are reduced or the rising rate of the gate potential of output MOS transistors M1 and M2 is reduced as shown by broken lines in FIG. 6A. In this way, the current driving abilities of output MOS transistors M1 and M2 are reduced so that the potential of output terminal N1 can be smoothly changed. However, in this case, the rising time will be delayed by td, significantly affecting the high speed characteristic (access time in the case of memory integrated circuit) of the semiconductor integrated circuit.

Further, in order to suppress the power source potential variation at the time of change of output data, the following method has been proposed. In this method, an intermediate potential setting circuit for creating an intermediate potential level of the power source potential and a switching circuit are provided to set an intermediate potential between the power source potential and the ground potential. The switching circuit is turned on immediately before the data output so as to supply the intermediate potential output of the intermediate potential setting circuit to the output node of the data output circuit, thus previously setting the output node to the intermediate potential.

However, the above method has a disadvantage that the current consumption will be large if a resistor dividing circuit is used as the intermediate potential setting circuit. To avoid an increase of power consumption, it may be proposed that the current flowing through the resistor dividing circuit to preset an intermediate potential be limited. If the current is limited, however, it will take longer to preset the intermediate potential.

SUMMARY OF THE INVENTION

This invention has been made to solve the problem caused by using an intermediate potential setting circuit in order to preset the data output node of a data output circuit such as a semiconductor memory device to an intermediate potential immediately before the data output. An object of this invention is to provide an intermediate potential setting circuit which is characterized by small current consumption so that the intermediate potential can be rapidly set.

An intermediate potential setting circuit (11) according to this invention includes pair of transistors (M4 and M5) whose gate terminals are connected to receive a control signal (φp) and which are set to the conductive state in response to the control signal (φp) set at an active-level, and a pair of complementary transistors (M3 and M6) whose gate terminals are connected to a line (5) to be set to an intermediate potential and whose drain terminals are respectively connected to their own gate terminals via the respective transistors (M4 and M5). When one of the transistors forming this complementary pair, i.e., transistor M3, is on, the other transistor, i.e., transistor M6 is off. Hence, no breeder current flows in circuit. This means that the current consumption of circuit 11 is relatively small.

The intermediate setting circuit is connected to data output line (5) of a buffer circuit, for example, and is used to set data output line (5) to the intermediate potential of power source potential (1) when data output preset control signal (φp) is activated in the pulse form before data is output to data output line (5). When control signal (φp) is in the non-active state "0", tri-state buffer circuit (6) is kept in the high impedance state, thus giving no influence on data line (5). When control signal (φp) is set to an active level, data output line (5) is charged or discharged according to the current potential of data line (5). When data output line (5) is set to a preset intermediate potential, control signal (φp) is set into the non-active state "0" and intermediate potential setting circuit (10) is set into the high impedance condition again. Therefore, the charging or discharging current flowing at the time of data output may be reduced, and consequently fluctuation in the power source potential in the chip can be significantly suppressed. Further, a current which prevents the charging or discharging operation will not flow into intermediate potential setting circuit (11) when data output is inverted, since circuit (11) is at a high impedance. Therefore, data output can be easily inverted, thus attaining a high speed operation.

BRIEF DESCRIPTION OF THE DRAWINGS

FIG. 1 is a circuit diagram of a data output circuit including an intermediate potential setting circuit according to one embodiment of this invention;

FIG. 2 is a timing chart showing the operation of the data output circuit of FIG. 1;

FIGS. 3A and 3B are waveform diagrams illustrating the operation of the data output circuit of FIG. 1;

FIGS. 6A and 6B are waveform diagrams showing the operation of the circuit of FIG. 4;

DETAILED DESCRIPTION OF THE PREFERRED EMBODIMENT

There will now be described a embodiment of this invention with reference to the accompanying drawings.

Figure 4:
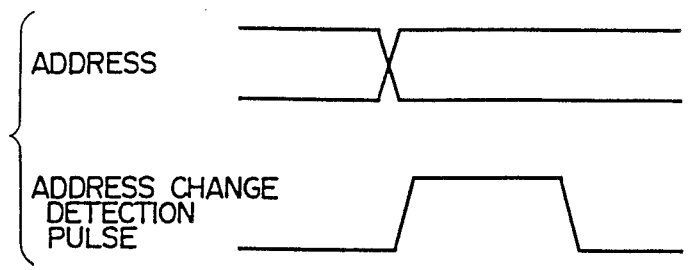
FIG. 4 is a timing chart of preset control signal $\phi p$ used in the data output circuit of FIG. 1 in a case where this invention is applied to a memory integrated circuit including an address change detection circuit.
Figure 5:
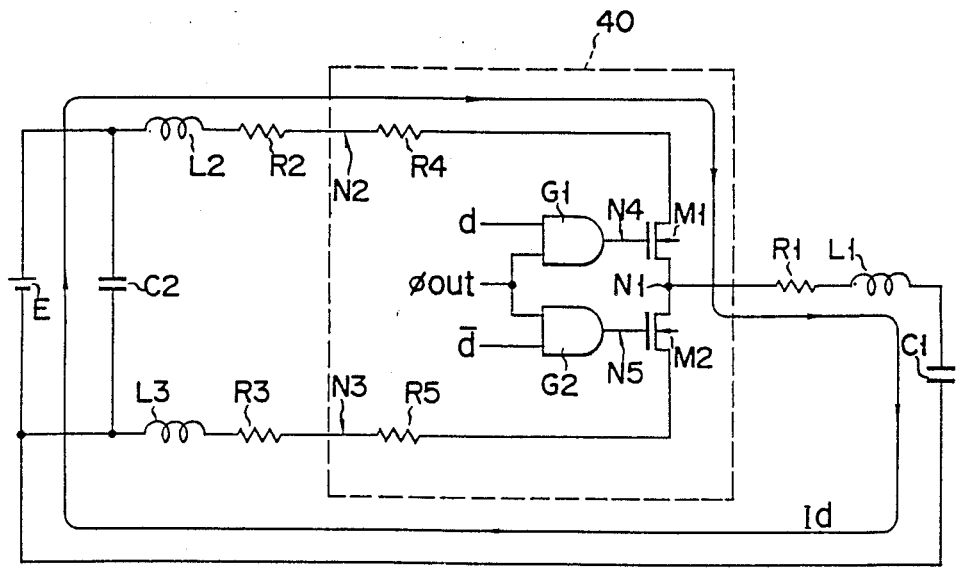
FIG. 5 is a circuit diagram showing the data output circuit, power source system and output load section of the conventional semiconductor integrated circuit.

FIG. 1 shows data output circuit 10 formed on a semiconductor integrated circuit chip, that is, a buffer circuit, intermediate potential setting circuit 11, power source line 1 and ground line 2. Data output circuit 10 has MOS transistors M1 and M2 connected in series between power source line 1 and ground line 2. The buffer circuit includes AND gates G1 and G2 which are connected to receive output control signal $\phi$out and complementary data d and $\bar{d}$ from an internal circuit (not shown) formed on the chip. The output signals of AND gates G1 and G2 are supplied to gate terminals N4 and N5 of output MOS transistors M1 and M2. In FIGS. 1, 3 and 4 denote parasitic resistors associated with power source line 1 and ground line 2, N1 a data output terminal, N2 a power source terminal, and N3 a ground terminal.

Further, intermediate potential setting circuit 11 has a function of tri-state buffer 6 which receives a potential of data output line 5 and data output preset control signal $\phi p$ and in which the impedance between power source line 1 and data output line 5 and that between data output 5 and ground line 2 are controlled in response to the received signals. Tri-state buffer circuit 6 includes P-channel MOS transistor M3 and N-channel MOS transistor M4 connected in series between power source line 1 and data output line 5 and N-channel MOS transistor M5 and P-channel MOS transistors M6 connected in series between data output line 5 and ground line 2. The gate of P-channel MOS transistor M3 and the gate of ground line side N-channel MOS transistor M6 connected to the data output line 5, and data output preset control signal $\phi p$ is supplied to the gates of N-channel MOS transistors M4 and M5 which are connected at one end of data output line 5.

Figure 7A:
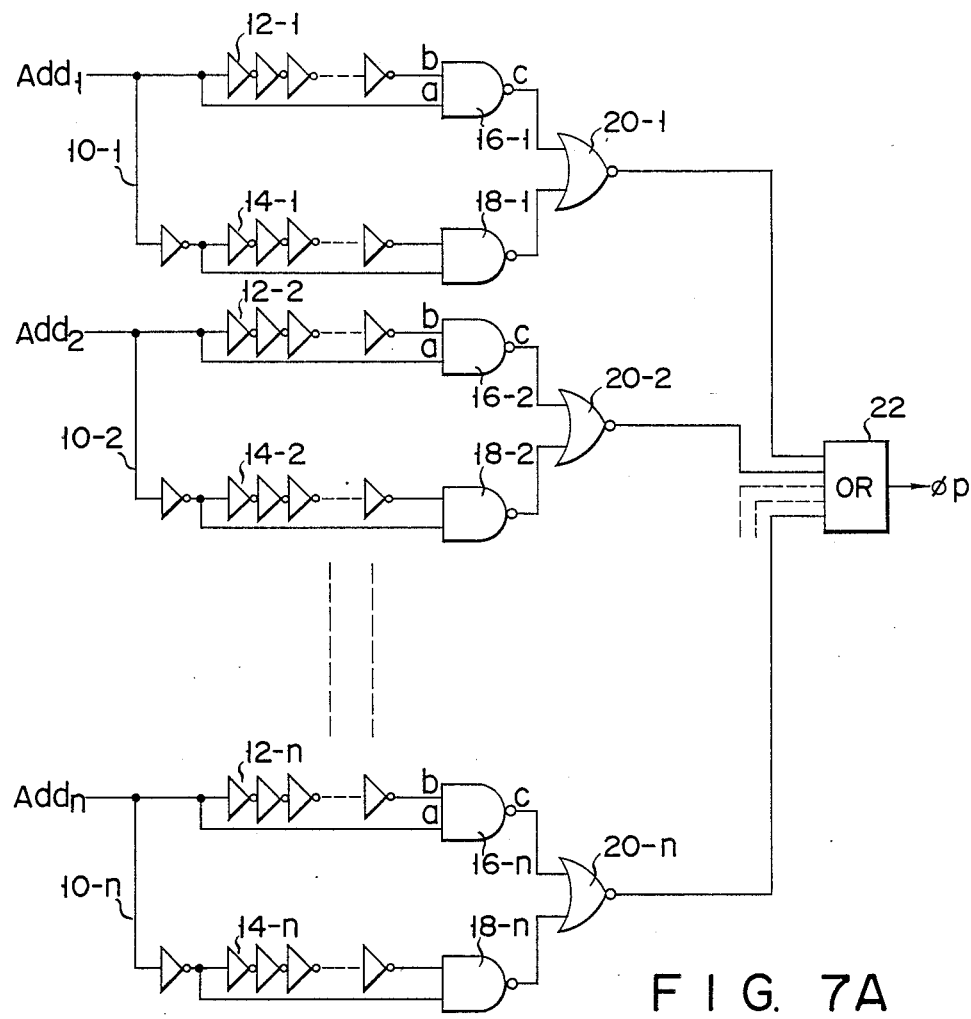
FIG. 7A is a circuit diagram of a circuit for supplying preset control signal $\phi p$.
Figure 7B:
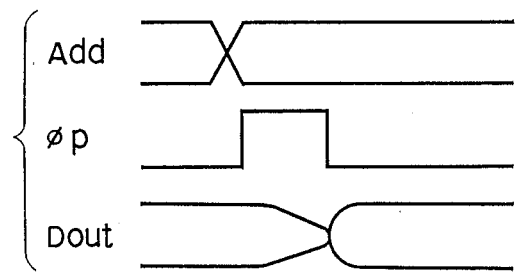
FIG. 7B illustrate a timing chart explaining the operating of the circuit of FIG. 7A.

The data preset control signal can be derived from a circuit shown in FIGS. 7A and 7B. The circuit is a transition circuit having inverters 12-1 to 12-n, 14-1 to 14-n, and AND circuits 16-1 to 16-n, 18-1 to 18-n and functioning to detect change of address signals Addl to Addn. In reality, the circuit can be modified as required. (For example, the circuit of inverters 12, 14 can be replaced with a CR delay circuit.)

Next, the operation of the buffer circuit and intermediate potential setting circuit 11 is explained with reference to FIGS. 2, 3A and 3B. When preset control signal $\phi p$ is in the non-active state ("0" level, in this embodiment), N-channel MOS transistors M4 and M5 of tri-state buffer circuit 6 are set in the OFF states. As a result, tri-state buffer circuit 6 is set in the high output impedance state. Next, when preset control signal $\phi p$ is set into the active state ("1" level in this embodiment), the operation is effected according to the current potential of data output line 5.

That is, when the potential of data output line 5 is at a low level ("0" level), P-channel MOS transistor M3 is turned on and N-channel MOS transistor M6 turned off so that data output line 5 ca be charged via P-channel MOS transistor M3 and N-channel MOS transistor M4 which is turned on by control signal $\phi p$. When the potential of data output line 5 is raised by the charging operation and exceeds the threshold voltage of N-channel MOS transistor M6, N-channel MOS transistor M6 is also turned on. As a result, transistors M3 to M6 are all set on, the potential of data output line 5 is set and kept at preset voltage Vs (intermediate potential between the potential of power source line 1 and the potential of ground line 2) which is determined by transistors M3 to M6.

Next, when output control signal $\phi$out is set to "1" level, one of the outputs of AND gates G1 and G2 is set to "1" and the other AND gate is set to "0" in response to output data d and $\bar{d}$ of the internal circuit. As a result, a corresponding one of output transistors M1 and M2 turned on and the other transistor is turned off, thus charging data output line 5 as shown by a solid line in FIG. 3A or discharging data output line 5 as shown by broken lines in FIG. 3A. In this case, data output line 5 is set at preset potential Vs (intermediate potential) as described before, preset control signal $\phi p$ is set to "1" level in the pulse form before output control signal $\phi$out is set to "1" level. The charging or discharging operation of data output line 5 effected at the data output time is started from preset potential Vs. Therefore, the charging or discharging current flowing at the data output time can be reduced, and variations in the potential of power source terminal N2 in the chip and the potential of ground terminal N3 can be significantly suppressed as shown by broken lines in FIGS. 3A, 3B (at the data "0" output time). Further, since tri-state buffer circuit 6 is set in the high impedance state at the data output time, it becomes easy to invert the data output, thus enhancing the operation speed of the data output.

In the above operation, a current flows via transistors M3 to M6 of tri-state buffer circuit 6 and is consumed simply as a current loss or power loss in the integrated circuit. However, the penetration current is caused when the potential of data output line 5 is changed to some extent by the charging or discharging operation so as to turn on P-channel MOS transistor M6. Therefore, generation of the current can be limited only in an extremely brief period of time and the penetration current can be suppressed to substantially 0 by suitably adjusting the timing of preset control signal $\phi p$.

In a case where intermediate potential setting circuit 11 is used in the memory integrated circuit having an address change detection circuit, an address change detection pulse generated at the time of address change can be used as preset control signal $\phi p$ as shown in FIG. 4. In this case, it becomes possible to start the data output preset operation in response to the address change detection pulse at the timing of the trailing edge of the address change detection pulse before data access operation is started. Therefore, a circuit for generating preset control signal $\phi p$ is not necessary.

As described above, according to intermediate potential setting circuit 11 of this invention, fluctuation in the power source voltage at the time of data output can be effectively suppressed by presetting data output line 5 to the intermediate potential, preventing the internal circuit of the integrated circuit from being erroneously operated. Further, the current consumption of intermediate potential setting circuit 11 is extremely small, making it possible to enhance the inverting speed of data output. Therefore, when intermediate potential setting circuit 11 is used in the memory integrated circuit, for example, the access time at the data readout time can be shortened and the reliability of the memory operation can be enhanced.

What is claimed is:

1. An intermediate potential setting circuit comprising:
   first and second power source lines;
   an intermediate potential-setting line;
   a transistor pair including a first transistor and a second transistor, each of said first and second transistors having a first terminal connected to said intermediate potential-setting line, a second terminal, and a gate terminal to which a control signal is supplied; and
   a complementary transistor pair including a third transistor and a fourth transistor, said third transistor having a first terminal connected to said first power source line, a second terminal connected to the second terminal of said first transistor, and a gate terminal connected to said intermediate potential-setting line, said fourth transistor having a first terminal connected to the second terminal of said second transistor, a second terminal connected to said second power source line, and a gate terminal connected to said intermediate potential-setting line.

2. An intermediate potential setting circuit according to claim 1, wherein said transistor pairs include an MOS transistor.

3. An intermediate potential setting circuit according to claim 1, wherein said intermediate potential-setting line is incorporated in a semiconductor integrated circuit.

4. An intermediate potential setting circuit according to claim 1, wherein each of said first and second transistors includes a P-type MOS transistor.

5. An intermediate potential setting circuit according to claim 1, wherein each of said first and second transistors includes an N-type MOS transistor.

6. An intermediate potential setting circuit according to claim 1, wherein said third and fourth transistors include P-type and N-type MOS transistors.

7. An intermediate potential setting circuit according to claim 1, wherein the gates of the first and second transistor are supplied with a common control signal.

8. A data output circuit comprising:
   a buffer circuit, having a data output line and being in a semiconductor integrated circuit, for controlling an impedance between a power source line and the data output line and an impedance between a ground line and the data output line; and
   means for setting an intermediate potential, coupled to means for receiving a data output preset control signal and connected between said data output line and said power source line, and between said data output line and said ground line, for setting the data output line at an intermediate potential of a power source potential if the data output preset control signal is set active before said buffer circuit outputs data to the data output line.

9. A data output circuit according to claim 8, wherein said intermediate potential setting means comprises:
   first and second power source lines;
   an intermediate potential-setting line;
   a transistor pair including a first transistor and a second transistor, each of said first and second transistors having a first terminal connected to said intermediate potential-setting line, a second terminal, and a gate terminal to which a control signal is supplied; and
   a complementary transistor pair including a third transistor and a fourth transistor, said third transistor having a first terminal connected to said first power source line, a second terminal connected to the second terminal of said first transistor, and a gate terminal connected to said intermediate potential-setting line, said fourth transistor having a first terminal connected to the second terminal of said second transistor, a second terminal connected to said second power source line, and a gate terminal connected to said intermediate potential-setting line.

10. A data output circuit according to claim 8, wherein said intermediate potential setting means comprises transistor pairs which include MOS transistors.

11. A data output circuit according to claim 8, wherein said intermediate potential setting means comprises an intermediate potential-setting line incorporated in a semiconductor integrated circuit.

12. A data output circuit according to claim 8, wherein said intermediate potential setting means comprises a transistor pair which include P-type MOS transistors.

13. A data output circuit according to claim 8, wherein said intermediate potential setting means comprises a transistor pair which include N-type MOS transistors.

14. A data output circuit according to claim 8, wherein said intermediate potential setting means comprises a complementary transistor pair which include P-type and N-type MOS transistors.

15. An intermediate potential setting circuit according to claim 9, wherein the gates of the first and second transistor are supplied with a common control signal.

16. An output circuit comprising an output buffer circuit and an output presetting circuit each being in a semiconductor integrated circuit, said output presetting circuit including a tri-state circuit and an impedance control circuit, an output preset control signal circuit being connected to said tri-state circuit, and an output terminal connected to said impedance control circuit, for controlling an impedance between a power source and said output terminal, said output terminal being preset at an intermediate potential between a potential of said power source and a ground potential if the output preset control signal circuit is active and before said output buffer circuit supplies data to said output terminal;

wherein said output presetting circuit is connected between said output terminal and said power source, and between said output terminal and a terminal bearing the ground potential.

17. A data output presetting circuit comprising a tri-state buffer circuit in a semiconductor integrated circuit, the buffer circuit including means for controlling impedances between a power source line and a data output line, and between a ground line and the data output line, wherein the buffer circuit is supplied with a potential of the data output line, and includes a field effect transistor whose gate receives a data output preset control signal; and the data output line is set at an intermediate potential of the power source potential when the data output preset control signal becomes active but before a data output circuit supplies data to the output line.

* * * * *

UNITED STATES PATENT AND TRADEMARK OFFICE
CERTIFICATE OF CORRECTION

PATENT NO. : 4,963,774
DATED : October 16, 1990
INVENTOR(S) : Masami Masuda

It is certified that error appears in the above-identified patent and that said Letters Patent is hereby corrected as shown below:

Column 3, line 25, change "illustrate" to --illustrates--.

Column 5, claim 2, lines 50 & 51, change "an MOS transisitor to --transistors--.

Column 5, claim 7, line 67, change "transistor" to --transistors--.
Column 6, claim 15, line 58, change "transistor" to --transistors--.

Signed and Sealed this

Eighth Day of February, 1994

Attest:

BRUCE LEHMAN

Attesting Officer

Commissioner of Patents and Trademarks